United States Patent
Koike et al.

(10) Patent No.: US 7,755,192 B2
(45) Date of Patent: Jul. 13, 2010

(54) COPPER INTERCONNECTION STRUCTURE, BARRIER LAYER INCLUDING CARBON AND HYDROGEN

(75) Inventors: Junichi Koike, Sendai (JP); Akihiro Shibatomi, Sendai (JP)

(73) Assignees: Tohoku University, Sendai (JP); Advanced Interconnect Materials LLC, Sendai (JP)

( * ) Notice: Subject to any disclaimer, the term of this patent is extended or adjusted under 35 U.S.C. 154(b) by 0 days.

(21) Appl. No.: 12/383,524

(22) Filed: Mar. 24, 2009

(65) Prior Publication Data

US 2009/0243112 A1    Oct. 1, 2009

(30) Foreign Application Priority Data

Mar. 25, 2008    (JP)    ............................. 2008-078260

(51) Int. Cl.
*H01L 23/48*    (2006.01)
*H01L 23/52*    (2006.01)
*H01L 29/40*    (2006.01)

(52) U.S. Cl. ............... 257/751; 257/762; 257/E21.021; 257/E21.584

(58) Field of Classification Search ................. 257/751, 257/E21.021, E21.584, 762
See application file for complete search history.

(56) References Cited

U.S. PATENT DOCUMENTS

| | | | | |
|---|---|---|---|---|
| 3,811,183 | A * | 5/1974 | Ceiling | 29/827 |
| 6,815,824 | B2 * | 11/2004 | Shioya et al. | 257/760 |
| 6,927,161 | B2 * | 8/2005 | Ruelke et al. | 438/637 |
| 7,019,399 | B2 * | 3/2006 | Venkatraman et al. | 257/751 |
| 7,132,732 | B2 * | 11/2006 | Ohto et al. | 257/637 |
| 7,276,441 | B1 * | 10/2007 | Cui et al. | 438/654 |
| 7,304,384 | B2 * | 12/2007 | Koike et al. | 257/751 |
| 7,612,451 | B2 * | 11/2009 | Shih et al. | 257/751 |
| 2003/0042613 | A1 * | 3/2003 | Shioya et al. | 257/762 |
| 2003/0077902 | A1 * | 4/2003 | Andreas et al. | 438/687 |
| 2004/0046261 | A1 * | 3/2004 | Ohto et al. | 257/774 |
| 2004/0124531 | A1 * | 7/2004 | Venkatraman et al. | 257/751 |
| 2004/0126957 | A1 * | 7/2004 | Sezi | 438/216 |

(Continued)

FOREIGN PATENT DOCUMENTS

JP    S59-043570    3/1984

(Continued)

OTHER PUBLICATIONS

Contents of Notice of Reasons for Rejection in Japanese Patent Application No. 2008-078260, Dispatched date:Aug. 25, 2009, Japan Patent Office.

*Primary Examiner*—Leonardo Andújar
*Assistant Examiner*—Teresa M Arroyo
(74) *Attorney, Agent, or Firm*—Masuvalley & Partners (57) ABSTRACT

A copper interconnection structure includes an insulating layer, an interconnection and a barrier layer. The insulating layer includes silicon (element symbol: Si), carbon (element symbol: C), hydrogen (element symbol: H) and oxygen (element symbol: O). The interconnection is located on the insulating layer, and the interconnection includes copper (element symbol: Cu). The barrier layer is located between the insulating layer and the interconnection. The barrier layer includes an additional element, carbon (element symbol: C) and hydrogen (element symbol: H). The barrier layer has atomic concentrations of carbon (element symbol: C) and hydrogen (element symbol: H) maximized in a region of a thickness of the barrier layer where the atomic concentration of the additional element is maximized.

12 Claims, 2 Drawing Sheets

U.S. PATENT DOCUMENTS

| | | | |
|---|---|---|---|
| 2005/0006775 A1* | 1/2005 | Huang et al. | 257/758 |
| 2005/0042858 A1* | 2/2005 | Li et al. | 438/628 |
| 2005/0042889 A1* | 2/2005 | Lee et al. | 438/780 |
| 2005/0208758 A1* | 9/2005 | Lu et al. | 438/623 |
| 2007/0184661 A1* | 8/2007 | Bian et al. | 438/692 |
| 2008/0203570 A1* | 8/2008 | Edelstein et al. | 257/751 |
| 2009/0212432 A1* | 8/2009 | Koike | 257/751 |
| 2009/0239374 A1* | 9/2009 | Kim et al. | 438/631 |

FOREIGN PATENT DOCUMENTS

| | | |
|---|---|---|
| JP | S61-294838 | 12/1986 |
| JP | S63-156341 | 6/1988 |
| JP | H01-202841 | 8/1989 |
| JP | H02-050432 | 2/1990 |
| JP | H02-062035 | 3/1990 |
| JP | H02-119140 | 5/1990 |
| JP | H05-047760 | 2/1993 |
| JP | 3220760 | 10/1993 |
| JP | H06-140398 | 5/1994 |
| JP | H06-310509 | 11/1994 |
| JP | 07300680 A * | 11/1995 |
| JP | H11-054458 | 2/1999 |
| JP | H11-087349 | 3/1999 |
| JP | H11-186273 | 7/1999 |
| JP | 2000-068269 | 3/2000 |
| JP | 2001-044156 | 2/2001 |
| JP | 2004-266178 | 9/2004 |
| JP | 2005-277390 | 10/2005 |
| JP | 2006-024968 | 1/2006 |
| JP | 2007-059660 | 3/2007 |
| JP | 2007-59734 | 3/2007 |
| JP | 2007-072428 | 3/2007 |
| JP | 2007-081113 | 3/2007 |
| JP | 2007-096241 | 4/2007 |
| JP | 2007-109687 | 4/2007 |
| JP | 2007-149813 | 6/2007 |
| WO | WO2007/100125 A1 | 9/2007 |
| WO | WO 2006/254347 A1 | 3/2009 |

* cited by examiner

COPPER INTERCONNECTION STRUCTURE, BARRIER LAYER INCLUDING CARBON AND HYDROGEN

This application claims priority under 35 U.S.C. §119 from Japanese patent application Serial No. 2008-078260, filed Mar. 25, 2008, entitled "Copper interconnection structure, semiconductor device and method for forming copper interconnection structure", which is incorporated herein by reference in its entirety.

TECHNICAL FIELD

The present invention relates to a copper interconnection structure, a semiconductor device and a method for forming the copper interconnection structure.

BACKGROUND OF THE INVENTION

An interconnection for a large-scale system integration (LSI), for example, CPU (central processing unit) and MPU (micro processing unit), and for a silicon semiconductor device, such as a thin-film transistor (abbreviation: TFT) used for a liquid crystal display device (abbreviation: LCD) need to be formed from a low-electrical resistance material having a high electrical conductive characteristic in order to achieve improvements in device properties, such as the reduction of a delay time on signal transmissions. In addition, for example, in a semiconductor memory device such as a NAND-type flash memory, an interconnect technology of a fine structure, for example, an ultrafine structure having a line width of 45 nanometer (unit: nm), 32 nm or 22 nm, is required in order to further increase the memory capacity, or increase the integration density.

In accordance with the development trend of the semiconductor device industry, instead of the conventional aluminum (element symbol: Al), in recent years, a technology which configures an interconnection for LSI or LCD by using a body (interconnection body) mainly formed from copper (element symbol: Cu) has been disclosed. The copper has a higher resistance against the electromigration (abbreviation: EM) and the stressmigration (abbreviation: SM) than Al. (For example, refer to Japanese Unexamined Patent Application Publication No. 61-294838, Japanese Unexamined Patent Application Publication No. 63-156341, Japanese Unexamined Patent Application Publication No. 01-202841, Japanese Unexamined Patent Application Publication No. 02-050432, Japanese Unexamined Patent Application Publication No. 05-047760, Japanese Unexamined Patent Application Publication No. 11-087349, and Japanese Unexamined Patent Application Publication No. 2007-81113).

As a method for forming a copper interconnection including an interconnection body made from Cu, which has a higher electrical conductivity than Al, there has been a conventionally known method for forming a copper interconnection. The method uses a copper alloy including various metal elements as additional elements. For example, there is a method for forming a copper interconnection by using a copper alloy (Cu—Mg alloy) which includes magnesium (element symbol: Mg) as an additional element. (For example, refer to Japanese Unexamined Patent Application Publication No. 11-054458, Japanese Unexamined Patent Application Publication No. 11-186273, and Japanese Unexamined Patent Application Publication No. 2006-24968). In addition, there is a method for forming a copper interconnection by using a copper alloy which includes silver (element symbol: Ag), zirconium (element symbol: Zr), cadmium (element symbol: Cd), or chromium (element symbol: Cr). (For example, refer to Japanese Unexamined Patent Application Publication No. 02-050432, Japanese Unexamined Patent Application Publication No. 59-043570, Japanese Unexamined Patent Application Publication No. 02-062035 and Japanese Patent No. 3220760). For example, there is a method for forming a copper interconnection by using a Cu—Sn alloy which includes tin (element symbol: Sn) as an additional element. (For example, refer to Japanese Unexamined Patent Application Publication No. 02-050432 and Japanese Unexamined Patent Application Publication No. 2007-72428).

A copper interconnection, which is made from a copper alloy as its material, and which is used for LCD, for example, is formed on a glass substrate containing silicon (element symbol: Si) and oxygen (element symbol: O). In addition, for example, a copper interconnection having a damascene structure, which is used for LSI, is generally formed on an interlayer insulating film structured by an oxide layer containing silicon and oxygen, and formed on a silicon (Si) substrate. (For example, refer to Japanese Unexamined Patent Application Publication No. 2007-059660). For example, a copper interconnection is formed on silicon dioxide ($SiO_2$), silicon nitride ($Si_3N_4$), aluminum oxide ($Al_2O_3$) or a phospho silicate glass (for example, refer to Japanese Unexamined Patent Application Publication No. 02-050432) or formed on an oxide insulated layer, which contains silicon and oxygen, such as silicon carbide oxide (SiOC), silicon fluoride oxide (SiOF) (for example, refer to Japanese Unexamined Patent Application Publication No. 2005-277390) or porous silica (for example, refer to Japanese Unexamined Patent Application Publication No. 2004-266178) in order to achieve an electrical isolation between the copper interconnection and the silicon substrate.

When a copper interconnection is formed on an oxide layer by using a copper alloy as its material, it is required to prevent an element constituting the oxide layer, such as silicon, from diffusing into the copper interconnection body in order to obtain the copper interconnection having an excellent conductive characteristic with a low electrical resistance value. In addition, in order to avoid the degradation of the electronic insulation characteristics of the oxide layer, it is required to prevent copper, which constitutes the interconnection body, from diffusing into the oxide layer. In the conventional technology, a structure, in which a barrier layer is formed between the oxide layer and the copper interconnection body, is adopted so as to capture the silicon and the copper, which are diffusing, in order to prevent the silicon or the copper from diffusing into the copper interconnection body or the oxide layer. (For example, refer to Japanese Unexamined Patent Application Publication No. 01-202841). The barrier layer is formed from rare metals such as rhenium (element symbol: Re) (refer to Japanese Unexamined Patent Application Publication No. 2007-096241), tantalum (element symbol: Ta) (refer to Japanese Unexamined Patent Application Publication No. 2004-266178 and Japanese Unexamined Patent Application Publication No. 2001-044156), tantalum nitride (TaN) or titanium nitride (TiN) (refer to Japanese Unexamined Patent Application Publication No. 11-186273, Japanese Unexamined Patent Application Publication No. 2004-266178, and Japanese Unexamined Patent Application Publication No. 2000-068269), and tungsten (element symbol: W) (refer to Japanese Unexamined Patent Application Publication No. 2004-266178 and Japanese Unexamined Patent Application Publication No. 2001-044156), tungsten nitride (element symbol: WN) (refer to Japanese Unexamined Patent Application Publication No. 11-186273, Japanese Unexamined Patent Application Publication No. 2004-266178 and Japanese Unexamined Patent Application Publication No. 2000-068269).

There is another known technique for forming a copper interconnection. The technique uses a copper alloy including an additional element which results in forming a barrier layer by itself by reacting with oxygen or silicon constituting the oxide layer. Therefore this technique does not form a barrier layer from conventional tantalum or tantalum nitride. (For example, refer to Japanese Unexamined Patent Application Publication No. 2005-277390). As the additional element "which forms the barrier layer by itself", manganese (element symbol: Mn) is known. Therefore, a method for forming a copper interconnection is disclosed in which a Cu—Mn alloy which includes manganese as the additional element is used. (Refer to Japanese Unexamined Patent Application Publication No. 2007-059660, Japanese Unexamined Patent Application Publication No. 02-119140, Japanese Unexamined Patent Application Publication No. 06-140398, Japanese Unexamined Patent Application Publication No. 06-310509, WO 2006/025347A1, and WO 2007/100125A1).

For example, a copper interconnection for LSI is usually formed by filling a barrier layer and a copper interconnection body in a narrow trench portion which has an opening width perforated on an insulating film. The insulating film is referred to as an interlayer insulating film. In order to increase the integration degree of LSI, it is imperative to decrease a line width of an interconnection groove opening such as a trench or a contact hole, and to form a copper interconnection having a thin line width.

However, the more the line width of the interconnection is decreased, the more the ratio, which is made up by the barrier layer, is increased. Therefore, there is a problem that the electrical resistance of the resulting interconnection body is unnecessarily increased.

For example, in case when the ratio of the barrier layer in the interconnection formed on the SiOC oxide layer as an inner wall of a fine trench or hole portion, increases, such a problem occurs that the copper interconnection body having a low resistance-value cannot be stably obtained, and which results in trouble to prevent the increase of the integration degree of LSI. In addition, for example, in LCD, especially in a large LCD which needs a long interconnection, there is a disadvantage that the delay of the transmission signal occurs.

Meanwhile, in case when the thickness of the barrier layer is made thinner than the current condition, a sufficient barrier characteristic against the copper diffusion from the interconnection cannot be secured, therefore, the insulation characteristics of the interlayer insulating film cannot be secured, because the copper diffuses into the insulating film side. In addition, the resistance of the interconnection side becomes higher, because the silicon in the insulating film side diffuses toward the interconnection side by the counter diffusion. Therefore, in the current condition, it is difficult to reduce the thickness of the barrier layer further.

Here, for a copper interconnection which has a line width of 32 nm, which is expected to be the interconnection rule for next-generation silicon LSIs, a preferable thickness of the barrier layer is about 3.5 nm so as to obtain the copper interconnection body having a low electrical resistance value and to prevent the degradation of the insulation characteristics of the insulating film due to the diffusion of copper.

The present invention is provided to solve the problems described above. An object of the present invention is to provide a copper interconnection, a semiconductor device and a method for forming the copper interconnection. The copper interconnection, the semiconductor device and the method for forming the copper interconnection can hold a sufficient barrier property against the diffusing copper from the interconnection body side or the diffusing silicon from the insulating film side, and can secure the insulation characteristic of the insulating film as well as to realize the low electrical resistance value of the interconnection, even through the barrier layer is thinner. Accordingly, the copper interconnection, the semiconductor device and the method for forming the copper interconnection can decrease the line width of the interconnection and improve the integration degree of LSI.

SUMMARY OF THE INVENTION

In accordance with a first aspect of the present invention, a copper interconnection structure includes:

an insulating layer including silicon (element symbol: Si), carbon (element symbol: C), hydrogen (element symbol: H) and oxygen (element symbol: O);

an interconnection located on the insulating layer, the interconnection including copper (element symbol: Cu); and a barrier layer located between the insulating layer and the interconnection, the barrier layer including an additional element, carbon (element symbol: C) and hydrogen (element symbol: H);

wherein the barrier layer has atomic concentrations of carbon (element symbol: C) and hydrogen (element symbol: H) maximized in a region of a thickness of the barrier layer where the atomic concentration of the additional element is maximized.

In the first aspect of the present invention described above, the barrier layer includes the additional element, carbon and hydrogen. In addition, each atomic concentration of the carbon and the hydrogen is maximized at a position in the barrier layer's thickness direction where the atomic concentration of the additional element is maximized. That is, at the position where the atomic concentration of the additional element of the copper alloy such as manganese is maximized, the carbon atom and the hydrogen atom, which are both smaller than the additional element (for example, the carbon atomic radius is 0.91 Å whereas the manganese atomic radius is 1.35 Å), exist in their maximal concentrations. As compared with a conventional barrier layer in which only additional elements of copper are simply deposited (refer to WO2007/100125A1), the barrier layer of the present invention can more effectively block the diffusion passages of copper and silicon. Therefore, the present invention can provide the copper interconnection structure including the barrier layer which effectively prevents the copper and the silicon diffusions, and the copper interconnection structure including the barrier layer which can effectively capture the diffusing copper and silicon, can be formed. Accordingly, even though the barrier layer becomes thinner, it is possible to ensure the insulation characteristics of the insulating layer and to achieve the interconnection with low electrical resistance value, while the efficient blocking property against the diffusing copper from the interconnection and the diffusing silicon from the insulating layer can be maintained. As a result, the line width of the interconnection can be decreased and the integration degree of LSI can be improved.

In the first aspect of the present invention, the insulating layer may include carbon (element symbol: C) and hydrogen (H) as a hydrocarbon radical. Further, the number of the carbon (element symbol: C) atom of the hydrocarbon radical may be one or two. Further, the hydrocarbon radical may include a methyl radical ($-CH_3$).

According to this aspect, the carbon and the hydrogen in the insulating layer are in the form of the hydrocarbon radical. In this case, in the insulating layer, the bond strength between the hydrocarbon radical and a silicon atom is weaker than the bond strength between an oxygen atom and a silicon atom. Therefore, the bond between the hydrocarbon radical and the silicon atom can easily be dissociated. The dissociated hydrocarbon radical migrates into the barrier layer and is suitable to form the copper interconnection structure including the barrier layer which contains the carbon atom and the hydrogen atom. Further, in case when the hydrocarbon radical has one or two constituent carbons, it is preferable to moderately diffuse the hydrocarbon radical into the barrier layer, and to moderately remain the hydrocarbon radical in the insulating layer. As a result, the barrier layer can be formed on the insulating layer while the insulating properties of the insulating layer can be ensured. Furthermore, a case where the hydrocarbon radical includes a methyl radical is preferable because the methyl radical is a saturated hydrocarbon radical and the molecule size of the methyl radical is smaller than that of the ethyl radical.

In the first aspect of the present invention, the additional element may be manganese (element symbol: Mn).

According to this aspect, since the additional element is manganese, the copper interconnection structure which includes the barrier layer mainly composed of the manganese oxide can be formed. The manganese oxide can prevent the copper and the silicon from diffusing. In addition, the copper interconnection, which includes the barrier layer having an excellent adhesiveness with both of the insulating layer and the copper interconnection, can be achieved.

In the first aspect of the present invention, the barrier layer may have the atomic concentration of carbon (element symbol: C) and hydrogen (element symbol: H) maximized in a central region of a thickness of the barrier layer.

According to this aspect, at the central region of the thickness of the barrier layer, the atomic concentrations of the carbon and the hydrogen are maximized. Therefore, the carbon atomic concentration decreases at the surface region of the barrier layer which joints with the interconnection, which results in providing the copper interconnection structure including the barrier layer which is excellent in adhesiveness with the interconnection. In addition, the copper interconnection structure including the barrier layer which can substantially evenly inhibit the diffusion processes of the copper and the silicon can be provided.

In the first aspect of the present invention, the maximum atomic concentration of the carbon (element symbol: C) in the barrier layer may be not more than the maximum atomic concentration of the additional element in the barrier layer.

According to this aspect, it can be avoided that the barrier layer is mainly composed of the carbide of the additional element. Therefore, the copper interconnection structure including the barrier layer which has high electrical insulating characteristics and an excellent adhesiveness with the interconnection can be provided.

In the first aspect of the present invention, the maximum atomic concentration of the hydrogen (element symbol: H) in the barrier layer may be not more than the maximum atomic concentration of the additional element in the barrier layer. Further, the maximum atomic concentration of the hydrogen (element symbol: H) in the barrier layer may be not more than the maximum atomic concentration of the carbon (element symbol: C) in the barrier layer.

According to this aspect, it can be avoided that the barrier layer is mainly composed of the hydride of the additional element of the copper alloy. Therefore, the copper interconnection structure including the barrier layer which has high electrical insulating properties and an excellent adhesiveness with the interconnection can be provided. Further, in case when the maximum concentration of the hydrogen atom is equal to or less than the maximum concentration of the carbon atom, the copper interconnection structure including the barrier layer which has good electrical insulating properties can be obtained. Accordingly, a semiconductor device which has a low interconnection electrical resistance and a low leakage current can be provided.

In accordance with a second aspect of the present invention, a semiconductor device having a copper interconnection includes:

a silicon oxide carbide (SiOC) insulating film formed over a semiconductor substrate, the SiOC insulating film including silicon (element symbol: Si), oxygen (element symbol: O) and carbon (element symbol: C) in a form of a hydrocarbon radical;

a barrier layer formed on an inner surface of a groove disposed on the SiOC insulating film, the barrier layer including manganese (element symbol: Mn), carbon (element symbol: C) and hydrogen (element symbol: H); and an interconnection formed on the barrier layer and buried in the groove, the interconnection including copper (element symbol: Cu);

wherein the barrier layer has atomic concentrations of carbon (element symbol: C) and hydrogen (element symbol: H) maximized in a part of a thickness of the barrier layer in which the atomic concentration of the manganese (element symbol: Mn) is maximized.

In the second aspect of the present invention described above, the barrier layer includes manganese, carbon and hydrogen. In addition, each atomic concentration of the carbon and the hydrogen is maximized at a position in the barrier layer's thickness direction where the atomic concentration of manganese is maximized. That is, at the position where the atomic concentration of the manganese is maximized, the carbon atom and the hydrogen atom, which are both smaller than the manganese atom (for example, the carbon atomic radius is 0.91 Å whereas the manganese atomic radius is 1.35 Å), exist in their maximal concentrations. As compared with a conventional barrier layer in which only additional elements of copper are simply deposited (refer to WO2007/100125A1), the barrier layer of the present invention can block the diffusion passages of copper and silicon. Therefore, the present invention can provide the copper interconnection structure including the barrier layer which effectively inhibits the diffusion of the copper and the silicon, and the copper interconnection structure including the barrier layer which can more effectively capture the diffusing copper and silicon, can be formed. Accordingly, even though the barrier layer becomes thinner, it is possible to ensure the insulation characteristics of the insulating layer and to achieve the interconnection with low electrical resistance value, while the efficient blocking property against the diffusion of copper from the interconnection side and the diffusion of the silicon from the insulating film side can be maintained. As a result, the line width of the interconnection can be decreased and the integration degree of LSI can be improved.

In the second aspect of the present invention, the barrier layer may have the atomic concentration of carbon (element symbol: C) and hydrogen (element symbol: H) maximized in a central part of a thickness of the barrier layer.

According to this aspect, at the central region of the thickness of the barrier layer, the atomic concentration of the carbon and the hydrogen are maximized. Therefore, the carbon atomic concentration decreases at the surface region of the barrier layer in contact with the interconnection, which results in providing the copper interconnection structure including the barrier layer having excellent adhesiveness with the interconnection. In addition, the copper interconnection structure including the barrier layer which can substantially evenly inhibit the diffusion processes of the copper and the silicon can be provided.

In the second aspect of the present invention, the maximum atomic concentration of the carbon (element symbol: C) in the barrier layer may be not more than the maximum atomic concentration of the manganese (element symbol: Mn) in the barrier layer, and the maximum atomic concentration of the hydrogen (element symbol: H) in the barrier layer may be not more than the maximum atomic concentration of the carbon (element symbol: C) in the barrier layer.

According to this aspect, the copper interconnection structure, including the barrier layer which has good electrical insulating properties, can be obtained. Accordingly, a semiconductor device which has a low interconnection resistance and a low leakage current can be provided.

In accordance with a third aspect of the present invention, a method for forming a copper interconnection structure includes the steps of:

forming an insulating layer over a semiconductor substrate, the insulating layer including silicon (element symbol: Si), carbon (element symbol: C), hydrogen (element symbol: H) and oxygen (element symbol: O);

forming a copper (element symbol: Cu) alloy layer on the insulating layer in an atmosphere having a first volume concentration of oxygen (element symbol: O), the copper alloy layer including an additional element;

forming a copper layer on the copper alloy layer; and applying a heat treatment so as to form a barrier layer at and adjacent to an interface between the insulating layer and the copper alloy layer, and so as to form an interconnection by unifying a part of the copper alloy layer with the copper (element symbol: Cu) in the copper layer;

wherein the heat treatment is applied in an inert gas atmosphere having a second volume concentration of oxygen (element symbol: O) that is greater than the first volume concentration, and the heat treatment is applied at a temperature of not less than 300° C. and not more than 450° C.

In the third aspect of the present invention described above, the copper interconnection structure including the barrier layer, in which each atomic concentration of the carbon and the hydrogen is maximized at a position of the barrier layer's thickness direction where the atomic concentration of the additional element of the copper alloy is maximized, can be formed. That is, at the position where the atomic concentration of the additional element of the copper alloy such as manganese is maximized, the carbon atom and the hydrogen atom, which are both smaller than the additional element (for example, the carbon atomic radius is 0.91 Å whereas the manganese atomic radius is 1.35 Å), exist in their maximal concentrations. As compared with a conventional barrier layer in which only additional elements of copper are simply deposited (refer to WO2007/100125A1), the barrier layer of the present invention can effectively block the diffusion passages of copper and silicon. Therefore, the present invention can provide the copper interconnection structure including the barrier layer which effectively inhibits the diffusions of the copper and the silicon, and the copper interconnection structure including the barrier layer which can effectively capture the diffusing copper and silicon, can be formed. Accordingly, even though the barrier layer becomes thinner, it is possible to ensure the insulation properties of the insulating layer and to achieve the interconnection with a low electrical resistance value, while the efficient blocking property against the diffusion of copper from the interconnection side and the diffusion of silicon from the insulating layer side can be maintained. As a result, the line width of the interconnection can be decreased, and the integration degree of LSI can be improved.

In the third aspect of the present invention, the additional element may be manganese (element symbol: Mn), and the copper alloy layer may be formed at a temperature less than the temperature when the heat treatment is applied.

According to this aspect, since the additional element is manganese, the copper interconnection structure which includes the barrier layer mainly composed of the manganese oxide can be formed. The manganese oxide can exert blocking action on the diffusion of the copper and the silicon. In addition, the copper interconnection, which includes the barrier layer having an excellent adhesiveness with both of the insulating layer and the copper interconnection, can be achieved.

In the third aspect of the present invention, the first volume concentration may be less than 0.5 vol. ppm, and the second volume concentration may be not less than 0.5 vol. ppm and not more than 1.5 vol. ppm.

According to this aspect, the segregation of the carbon, the hydrogen and the atom of the additional element at the region near the connecting interface between the barrier layer and the insulating layer, which occurs in an atmosphere where the oxygen volume concentration is too little, can be prevented. At the same time, the segregation of the carbon, the hydrogen and the atom of the additional element at the region near the joint interface between the barrier layer and the interconnection, which occurs in an atmosphere where the oxygen volume concentration is too much, can be prevented. Therefore, the carbon atom and the hydrogen atom in the barrier layer can be distributed in the form of the normal distribution curve. Further, the copper interconnection structure including the barrier layer, in which the carbon atom and the hydrogen atom are distributed in the way that each atomic concentration of the carbon and the hydrogen are maximized at the position in the barrier layer's thickness direction where the atomic concentration of the additional element of the copper alloy is maximized, can be formed.

In the third aspect of the present invention, the copper alloy layer may be formed on an inner surface of a trench of the insulating layer, and a thickness of the copper alloy layer may be not more than one fifth of a width of an opening of the trench.

According to this aspect, the width of the barrier layer which occupies a portion of the trench width does not become larger than the necessary width. Therefore, the copper interconnection structure including the barrier layer can be formed in the way that the barrier layer dose not sacrificially reduce the width of the interconnection to be formed, nor increase the interconnection electrical resistance.

In the third aspect of the present invention, a duration of the heat treatment may be not less than 10 minutes and not more than 80 minutes.

According to this aspect, efficient hydrocarbon radicals to configure the barrier layer can be properly diffused from the region near the surface of the insulating layer.

In the third aspect of the present invention, the insulating layer may be formed from a source material including a silicon atom, a source material including an oxygen atom and a source material including a hydrocarbon radical.

According to this aspect, the composition of each constituent element of the insulating layer can be adjusted by individually controlling the supply of each source material.

In the third aspect of the present invention, the insulating layer may be formed from a source material including both a silicon atom and an oxygen atom and a source material including a hydrocarbon radical.

According to this aspect, the carbon atomic concentration mainly existing in the form of the hydrocarbon radical in the insulating layer can be adjusted.

In the third aspect of the present invention, the insulating layer may be formed from a source material including both a silicon atom and a hydrocarbon radical and a source material including an oxygen atom.

According to this aspect, the supply of the source material including oxygen can be independently adjusted. Therefore, the insulating layer including the stoichiometrically excessive oxygen can be formed by excessively supplying the source material including oxygen.

DETAILED DESCRIPTION OF INVENTION

As an insulating layer for forming a barrier layer, a silicon dioxide ($SiO_2$) layer and a silicon nitride (SiN) layer are conventionally known. The effect of a barrier layer of the present invention, which contains an additional element of a copper alloy, carbon and hydrogen, can be brought about especially when the barrier layer is formed on a silicon series insulating layer containing carbon, hydrogen and oxygen. For example, the insulating layer is a SiOC insulating layer containing carbon and hydrogen in the form of a hydrocarbon radical. The hydrocarbon radicals may be connected through an atom such as oxygen which connects to a silicon atom. In addition, the hydrocarbon radical is attached to an aromatic hydrocarbon ring such as a phenyl radical ($-C_6H_5$) which is connected to a silicon atom. In addition, the hydrocarbon radical is attached to an atom such as oxygen constituting a methoxy radical ($-OCH_3$) and the like. In the present invention which forms the barrier layer containing carbon and hydrogen atoms by using the hydrocarbon radicals contained in the insulating layer, a SiOC insulating layer which is configured in a way that the hydrocarbon radical binds chemically to a silicon atom directly can preferably used. Incidentally, the SiOC insulating layer is formed on a semiconductor substrate such as a silicon substrate.

The bond strength between a silicon atom and a carbon atom constituting a hydrocarbon radical (Si—C) is smaller than the bond strength between a silicon atom and an oxygen atom (Si—O). The bond dissociation energy in Si—C is 318 kilo joule/mol (unit: kJ/mol), and the bond dissociation energy in Si—O is 531 kJ/mol, which is about 1.7 times stronger than that of Si—C (refer to [YUUKIKINZOKUKA-GOUBUTU-GOUSEIHOU OYOBI RIYOUHOU-(Organic Metallic Compound—Synthesis Method and Utilization Method)], 1st edition, 2nd print, p, 110, issued on 21 May 1992 by TOKYO KAGAKU DOJIN, under the editorship of AKIO YAMAMOTO). Therefore, an oxygen atom remains in the SiOC insulating layer with retaining the bond with the silicon atom. On the other hand, the bond between the hydrocarbon radical and the silicon atom can easily be dissociated because the hydrocarbon radical binds chemically to a silicon atom in a weaker manner. The dissociated hydrocarbon radical migrates into the barrier layer thereby contributing advantageously to configuring the barrier layer including carbon and hydrogen atoms.

In the present invention which forms a barrier layer containing carbon and hydrogen by diffusing and migrating hydrocarbon radicals contained in a SiOC insulating layer into the barrier layer, the hydrocarbon radical contained inside the SiOC insulating layer needs to be such a hydrocarbon radical, for example, which tends to migrate towards a coated layer and also tends to remain in the SiOC insulating layer in a heat treatment step conducted after the coated layer is deposited. The coated layer is used to form a barrier layer discussed below. The high hydrocarbon which has the large number of constituent carbons (refer to [YUUKIKAGAKU TAIYOU (Compendium of Organic Chemistry)], 6th edition after rewritten, p, 20, issued on 1 Mar. 1970 by YOKENDO, under the editorship of YUJIRO NOMURA) tends to be a large molecule, and the high hydrocarbon cannot easily diffuse as compared with a low hydrocarbon due to its size effect. Therefore, a large amount of the high hydrocarbons result in remaining in the SiOC insulating layer. Even though, that is advantageous to maintain the electronic insulation properties of the SiOC insulating layer, however, the high hydrocarbon cannot migrate so far forth as reaching inside the coated layer. Therefore, the high hydrocarbon has a disadvantage when used to form the barrier layer having carbon and hydrogen atoms.

In the hydrocarbon radical contained in the SiOC insulating layer, the number of the carbon atom of the hydrocarbon radical is preferably one or two. Especially, an aliphatic hydrocarbon radical which has one or two carbon atoms is preferable so as to diffuse properly and remain properly because its molecule size is not large as compared with a branched high hydrocarbon radical having a long chain and branched structure. Accordingly, the aliphatic hydrocarbon radical having one or two carbon atoms, in the neighborhood region of the surface of the SiOC insulating layer connected to the barrier layer is drawn into the barrier layer. Meanwhile, the hydrocarbon radicals which do not diffuse significantly result in remaining in more central portion in the SiOC insulating layer, and therefore the remaining hydrocarbon radicals can contribute to maintain the electrical insulating characteristic of the SiOC insulating layer.

As the aliphatic hydrocarbon radical which has one or two constituent carbons, and is contained in the SiOC insulating layer, a methyl, an ethyl, or a methylene radical is listed. When compared with the methyl radical and the ethyl radical which have a single bond ($\sigma$ bond) between carbon atoms, the methylene radical is an unsaturated hydrocarbon radical which includes a double bond ($\pi$ bond), and therefore, the methylene radical cannot easily diffuse due to the strong bond force with the atom such as silicon. Therefore, as the hydrocarbon radical which is contained in the SiOC insulating layer, the methyl and ethyl radicals, which are saturated hydrocarbon radicals, are preferable, and particularly, the methyl radical which has a smaller size of molecule is preferable.

The specific example of the SiOC insulating layer containing carbon and hydrogen atoms is a SiOC polymer layer which is composed of hydrogenated methylsilsesquioxane ($-Si(H)-O-Si(CH_3)-$) (refer to Japanese Unexamined Patent Application Publication No. 2007-059660) having a body in which the bond between a silicon atom and a hydrogen atom is linked via the bond between a silicon atom and an oxygen atom. Further, a dense or porous SiOC polymer layer composed of methylsilsesquioxane (—Si(CH$_3$)—O—Si(CH$_3$)—) (refer to Japanese Unexamined Patent Application Publication No. 2007-059660) having a body in which the chemical bond between a silicon atom and a methyl radical are linked via the bond between a silicon atom and an oxygen atom is listed as the specific example of the SiOC insulating layer containing carbon and hydrogen atoms. In addition, a SiOC including a hydrocarbon radical with addition of a halogen atom or a halogen atom, such as SiOCF, is here abbreviated to SiOC.

The SiOC insulating layer including the hydrocarbon radical of the present invention is formed by using each material of a source material including a silicon atom, a source material including an oxygen atom and a source material including a hydrocarbon radical. As the source material including a silicon atom, silicon hydride such as monosilane (molecular formula: SiH$_4$), disilane (molecular formula: Si$_2$H$_6$), halogenated silicon compounds such as dichlorosilane (molecular formula: SiH$_2$Cl$_2$) or trichlorosilane (molecular formula: SiHCl$_3$) may be used.

Although oxygen (molecular formula: O$_2$) is straightly listed as the source material including an oxygen atom, a straight-chain compound, a side-chain compound, an alicyclic compound, a cyclic compound, or a heterocyclic compound may also be used as long as those include an oxygen atom. For example, a straight-chain compound, a side-chain compound, an alicyclic compound, a cyclic compound, or a heterocyclic aliphatic which has addition of an alcohol (—OH) radical, or aliphatic or aromatic ketones which has addition of aromatic alcohols or a ketone (—C=O) radical may be used. Carbon monoxide (molecular formula: CO) and carbon dioxide (molecular formula: CO$_2$) and the like which have a carbon atom as well as an oxygen atom can be used as the source material including both of an oxygen atom and a carbon atom.

As the source material including a carbon atom for forming the SiOC insulating layer, hydrocarbon gases such as methane (CH$_4$) and ethane (C$_2$H$_6$) and the like, aliphatic halides of carbon such as perfluorocarbon, and carbon containing compounds such as aromatic hydrocarbons may be used. The aliphatic or aromatic hydrocarbon which has addition of an aliphatic hydrocarbon radical can be used to form the SiOC insulating layer of the present invention. In particular, the aliphatic or aromatic hydrocarbon which has a structure including an alkyl radical, which is a straight-chain aliphatic hydrocarbon, can be preferably used as the carbon material to form the SiOC insulating layer according to the present invention.

Among alkyl radicals, in particular, a straight-chain aliphatic hydrocarbon having an addition of hydrocarbon radical which includes one or two carbons can be preferably used as the carbon material for forming the SiOC insulating layer of the present invention. The alkyl radicals having one or two carbons include saturated hydrocarbon radicals such as a methyl (—CH$_3$) radical and an ethyl (—C$_2$H$_5$) radical, and unsaturated hydrocarbon radicals such as a methylene (=CH$_2$) radical. Those alkyl radicals occupy a smaller spatial volume as compared with a side-chain (branched) alkyl radicals such as an iso-prophyl (—CH(CH$_3$)$_2$) and the like having three or more carbons. (Refer to [YUUKIKAGAKU TAIYOU-(Compendium of Organic Chemistry)], p, 20, the editorship of YUUJIROU NOMURA). Therefore, those alkyl radicals can be easily migrated into the SiOC insulating layer due to their size effects, and are preferable as the alkyl radical to be contained in the SiOC insulating layer.

In a method for forming the SiOC insulating layer by individually using the source material including silicon, the source material including oxygen and the source material including carbon, which are for configuring the SiOC insulating layer, there is an advantage that the composition of each constituent element which configures the SiOC insulating layer can be adjusted by individually controlling the supply of each source material. For example, there is an advantage that the SiOC insulating layer including stoichiometrically-excessive oxygen can be formed by supplying the source material excessively including oxygen. Because the excessive oxygen exist in the SiOC insulating layer, which includes stoichiometrically-excessive oxygen, the number of oxygen atom which leaves the SiOC insulating layer and diffuse into the coated layer, can increase. Therefore, the oxide layer composed of the additional element of the copper alloy to be a barrier layer can be formed. However, it is not preferable to make the SiOC insulating layer contain excessive oxygen which is drastically deviated from the stoichiometric composition. Because the oxygen excessively exists, the oxygen liberated in the SiOC insulating layer pulls out the hydrocarbon radical contained in the SiOC insulating layer, and drives the hydrocarbon radical out from the SiOC insulating layer. As a result, the formation of the barrier layer containing carbon and hydrogen atoms can be disturbed. The oxygen composition is desirably equal to or less than +2% from the stoichiometric composition, and more preferably, the oxygen composition is equal to less than +1%.

Meanwhile, the SiOC insulating layer can be formed by using a single material which includes all of silicon, oxygen and carbon. For example, aliphatic or aromatic compounds, to which an alkoxy radical such as an ethoxyl radical (—OC$_2$H$_5$), for example, tetraethoxysilane (molecular formula: Si(OC$_2$H$_5$)$_4$ (abbreviation: TEOS)) is attached, can be used as the material to form the SiOC insulating layer. However, there is a case that the component ratio of each constituent element which configures the SiOC insulating layer cannot be advantageously adjusted as compared to the method described above, for forming the SiOC insulating layer by using the individual material for each constituent element and by controlling the supply of each source material individually.

In addition, the SiOC insulating layer according to the present invention can be formed by using a source material including a source material containing a silicon atom as well as an oxygen atom and another source material containing a hydrocarbon radical. As the source material including a silicon atom as well as an oxygen atom, silanols can be used, for example. When this source material system is used, there is an advantage that the atomic concentration of carbon, which mainly presents in the form of a hydrocarbon radical in the SiOC insulating layer can be adjusted. For example, there is an advantage that the SiOC insulating layer including stoichiometrically-excessive carbon in the form of the hydrocarbon radical can be formed by supplying the source material including carbon excessively. Because the excessive carbon exists in the SiOC insulating layer, which includes the stoichiometrically-excessive carbon, the hydrocarbon, radical which leaves the SiOC insulating layer and intrudes into the barrier layer, increases. Therefore, the hydrocarbon radical, or carbon atoms and hydrogen atoms evolved from the decomposition of the hydrocarbon radical, increase, thereby being advantage to form the barrier layer including carbon and hydrogen.

In addition, the SiOC insulating layer according to the present invention can be formed by using a source material including a silicon atom as well as a hydrocarbon radical and another source material including oxygen. For example, the SiOC insulating layer can be formed at, for example, 300 to 400° C. using trimethylsilane (molecular formula: $SiH(CH_3)_3$) as the source material including a silicon atom as well as a hydrocarbon radical and an oxygen gas as the source material containing oxygen with a general chemical vapor deposition (abbreviation: CVD) method or a plasma CVD method. In this material system, because the supply of the source material containing oxygen can be independently adjusted, there is an advantage that the SiOC insulating layer including stoichiometrically-excessive oxygen can be formed by supplying the source material excessively including oxygen. Because the excessive oxygen exist in the SiOC insulating layer which includes the stoichiometrically-excessive oxygen, the oxygen atom, which leaves the SiOC insulating layer and diffuses into the barrier layer, increases. Therefore, the oxygen can contribute to form the oxide stably which is composed of additional elements of the copper alloy to form the barrier layer.

The method for forming the SiOC insulating layer is not limited to the CVD method described above. For example, coating methods such as a spin coat method and a spray method can be used. In particular, when a poly-aromatic hydrocarbon or poly-aromatic ether, which is a polymer, is used as the source material of silicon, carbon, or oxygen, the method can be used in which these polymer are applied after properly dissolved or dispersed in solvent. As the solvent, cyclohexanol ($C_6H_{12}O$) and cyclohexanone ($C_6H_{12}O$) are listed. Without depending on the method for forming the SiOC insulating layer such as the CVD method or the coating methods, the thickness of the formed SiOC insulating layer is a design matter which should be properly decided depending on the trench width or the diameters of contact holes for the interconnection.

On the SiOC insulating layer, a barrier layer containing an atom added to a copper alloy, a carbon atom and a hydrogen atom is formed from the coated layer. The coated layer is formed by using the copper alloy to which the atom, which results in forming the oxide film together with oxygen atoms and the like constituting the SiOC insulating layer, is added. In particular, the barrier layer is formed by using the coated layer composed of a copper-manganese alloy (Cu—Mn) to which manganese is added as the alloying element, which forms the oxide by using itself. The concentration of manganese in the Cu—Mn alloy material is suitably equal to or greater than 1.0% and equal to or less than 25.0% based on the atomic concentration. When the Cu—Mn alloy material containing manganese atoms is used in such a range of concentration, the barrier layer containing manganese at the suitable atomic concentration, which is equal to or greater than 1.0% and equal to or less than 25.0%, can be formed.

In addition to manganese, the barrier layer can be formed by using Cu—Mn alloys including an element which has the self-diffusion coefficient, which is equal to or greater than copper, and which is more susceptible to oxidation than copper, as a primary material. Those elements include, for example, zinc (Zn), germanium (Ge), strontium (Sr), silver (Ag), cadmium (Cd), indium (In), tin (Sn), barium (Ba), praseodymium (Pr), and neodymium (Nd). Accordingly, as the Cu—Mn alloys, Cu—Mn—Ge alloy, Cu—Mn—Sn alloy, or Cu—Mn—Ge—In alloy can be listed. The total content of the elements contained in the copper in addition to the manganese is suitably equal to or greater than 1.0% and equal to or less than 25.0% based on the atomic concentration. Further, the content of the elements contained in the copper in addition to the manganese is preferably equal to or less than the atomic concentration of manganese contained in the copper.

In the present invention, it is most preferable structure in which the barrier layer is placed so as to be connected to the surface of the SiOC insulating layer. Therefore, the whole insulating layer does not always have to be composed only of the SiOC, and it is enough if only the surface of the insulating layer to be jointed to the barrier layer is composed of the SiOC. For example, there is no problem to use an oxide layer of layered structures, which have the surface of the SiOC insulating layer formed with its underlayer composed of SiOC layers or $SiO_2$ layers. Further, there is no problem to use layered structures formed from the SiOC insulating layer as its surface and a film which does not contain oxygen, for example, a silicon nitride (SiN) film.

As one example of the modification of the step to form the barrier layer of the present invention, such a means can be conceived that the barrier layer is formed through a thin film such as a tantalum film or a titanium nitride film, which are used conventionally as the barrier layer without forming the barrier layer directly on the SiOC insulating layer. However, as described below, in the present invention, the barrier layer is formed inside the coated layer adjacent to the connected interface with the SiOC insulating layer by having the hydrocarbon radicals existing in the SiOC insulating layer diffuse towards the coated layer formed from the copper alloy. Therefore, if the structure having such multiple barrier layers described above is adopted so as to cover the surface of the SiOC insulating layer, the hydrocarbon radicals are prevented from diffusing from the SiOC insulating layer into the coated layer formed from the copper alloy. Accordingly, such a structure having the multiple barrier layers cannot be used advantageously to form the barrier layer of the present invention. In addition, such a structure having the multiple barrier layers requires troublesome steps for forming the thin films as opposed to the convenient method of the present invention which forms the barrier layer by using additional elements added to the copper alloy, which can form the oxide layer using themselves.

In order to form the barrier layer, the thickness of the Cu—Mn coated layer deposited on the surface of the SiOC insulating layer as an interlayer insulating film is suitably equal to or less than about one fifth of the horizontal width (opening width) of the trench grooves which are formed on the interlayer insulating film to form interconnections. If the thickness of multilayered films or alloy films preliminarily deposited is excessive, the width of the barrier layer occupying the trench width increases. Therefore, the width for the copper interconnection body to be formed results in narrowing, which is disadvantage in forming the interconnection with a low electrical resistance value. The thickness of the coated layer is preferably equal to or greater than 0.5 nm in order to stably form the barrier layer with an excellent barrier properties in, for example, the Cu—Mn coated layer. More preferably, the thickness is in the range of 1 nm to 10 nm. Even though the coated layer is such a thin film, if the Cu—Mn coated layer is used, the barrier layer which can efficiently perform its function as the barrier layer can result in being formed. Therefore, there is no need to form a barrier layer which has the multiple layer structure as described above.

The single barrier layer or the multiple barrier layer is formed by using physical or chemical deposition means such as a sputter technique, an ion plating technique, an atomic layer epitaxy (abbreviation: ALE) technique, a CVD technique, a laser ablation technique. There is a technique for forming a multiple barrier layer by further depositing a conventional metallic layer, which is used conventionally as a constituent material for a barrier layer on the Cu—Mn coated layer. For example, there may be a technique for forming a dual barrier layer in which a Cu—Mn coated layer is formed by a radio frequency sputter technique, and a tantalum (Ta) layer is deposited on the Cu—Mn layer. However, this technique may cause a situation where the thickness of the barrier layer increases, which results in decreasing the width for the interconnection body. Therefore, it may be disadvantage to use this technique to obtain the copper interconnection body with a low resistance-value. In addition, the step for forming the barrier layer results in being redundant, and cumbersome.

It is preferable to form the coated layer, which is used for forming the barrier layer, under the atmosphere which does not contain oxygen. This is because that if the barrier layer is formed in the atmosphere containing oxygen, the hydrocarbon radicals existing inside the SiOC insulating layer are drawn from the SiOC insulating layer by the oxygen adsorbed on the SiOC insulating layer, which results in decreasing the hydrocarbon radicals to diffuse towards the coated layer for forming the barrier layer. That is, the barrier layer which contains carbon atoms cannot be advantageously formed. In particular, when the coated layer for forming the barrier layer is deposited, such an operation should be avoided that the coated layer is exposed to the atmosphere containing oxygen while the surface of the SiOC insulating layer is heated. If the hydrocarbon radicals, which should be remained in the SiOC insulating layer, escape, the electrical insulating properties of the SiOC insulating layer cannot be maintained, and which is disadvantageous.

In the atmosphere for depositing the coated layer, which is for forming the barrier layer, on the SiOC insulating layer containing the hydrocarbon radicals, the volume concentration of the oxygen should be less than 0.5 vol. ppm. The atmosphere where the oxygen is not substantially contained, such as the oxygen in the undetectable level, is the most preferable. What "the oxygen is not substantially contained" means is that the oxygen is not detected even though analytical instruments such as an oxygen concentration meter having the detection limit of ppb level, or a quadrupole mass spectrometer (abbreviation: Q-MASS) are used. In upstream operations before the coated layer, for forming the barrier layer, is deposited, if the SiOC insulating layer containing hydrocarbon radicals are exposed to high temperature in the atmosphere containing the oxygen volume concentration equal to or greater than 0.5 vol. ppm, volatile compounds are rapidly and significantly formed by the reaction of the hydrocarbon radicals existing in the SiOC insulating layer, especially in the region adjacent to its surface and the oxygen, which results in that most of the hydrocarbon radicals in the region adjacent to the surface of the SiOC insulating layer escape. Therefore, the number of the hydrocarbon radicals which can be migrated towards the coated layer to form the barrier layer decreases extremely, and the decreased number of the hydrocarbon radicals fails to reach the formation of the barrier layer containing carbon atoms and hydrogen atoms.

Further, when the coated layer, for forming the barrier layer on the SiOC insulating layer, is deposited, the temperature (diffusion temperature) for diffusing the hydrocarbon radicals in the SiOC insulating layer into the coated layer is preferably from 350° C. to less than 450° C. That is, it is desirable to deposit the coated layer for forming the barrier layer after the temperature of the silicon substrate, on which the SiOC insulating layer is mounted, is set to less than 350° C. For example, when the SiOC insulating layer is formed by a coating method including a curing process, it is desirable to set the temperature to less than 350° C. at both the coating process and the annealing process conducted after the coating process. When the coated layer is deposited, if the SiOC insulating layer is exposed to high temperature over 350° C., the hydrocarbon radicals significantly vaporizes from the inside of the SiOC insulating layer, and therefore the barrier layer containing carbon atoms and hydrogen atoms cannot be advantageously formed.

If the formation temperature of the barrier layer is extremely low, it is difficult to form the barrier layer having an excellent adhesiveness with the SiOC insulating layer due to the compressive strain of the coated layer. Typically, when the coated layer is formed at the temperature which is higher than the ambient temperature, and more preferably equal to or greater than 50° C., the coated layer for forming the barrier layer having an excellent adhesiveness with the SiOC insulating layer can be deposited.

After the coated layer is deposited, the barrier layer is formed by a heat treatment in which the silicon substrate is heated, the temperature of the coated layer is raised to the diffusion temperature, and the hydrocarbon radicals inside the SiOC insulating layer, especially, the hydrocarbon radicals existing in the region adjacent to the surface or the SiOC insulating layer are diffused towards the coated layer. If the film thickness of the coated layer is very thin, the barrier layer results in being formed throughout the entire volume of the coated layer. If the film thickness of the coated layer is thicker than the thickness of the barrier layer to be formed, the additional elements in the coated layer result in diffusing and moving towards the SiOC insulating layer side due to the heat treatment. Therefore, the barrier layer can be formed in the region at and adjacent to the connected interface between the coated layer and the SiOC insulating layer, while the coated layer in the region, which is adjacent to its surface side opposite to the connected interface, is composed mainly of copper because the additional elements in the copper alloy has been migrated to the SiOC insulating layer side.

When the hydrocarbon radicals existing in the region adjacent to the surface of the SiOC insulating layer are preferentially diffused into the coated layer, the suitable diffusion temperature is from equal to or greater than 350° C. to equal to or less than 450° C. In addition, in order to remain the hydrocarbon radicals in more inside portion of the SiOC insulating layer so as to maintain the electrical insulating properties of the SiOC insulating layer as well as to diffuse the hydrocarbon radicals in the region adjacent to its surface selectively towards the coated layer, the preferable temperature is from equal to or greater than 350° C. to equal to or less than 450° C. As the hydrocarbon radicals contained in the SiOC insulating layer are bigger molecules which occupy large space, it is preferable to set the diffusion temperature to higher temperature. For example, if the diffusion temperature of the methyl radical is from 350° C. to 400° C., the diffusion temperature of the ethyl radical is preferably set to from 400° C. to 450° C., which are greater than that of the methyl radical within the range of the diffusion temperature described above.

After the heat treatment is conducted to the coated layer formed on the SiOC insulating layer, the carbon atomic concentration in the region adjacent to the surface side of the SiOC insulating layer, in other words, the concentration such as the methyl radicals in the SiOC insulating layer, of the present invention, containing carbon atoms mainly in the form of hydrocarbon radicals is decreased as compared the concentration of the methyl radicals in the SiOC insulating layer in an as-grown state. This decrease of the hydrocarbon radical concentration occurs because the hydrocarbon radicals existing in the region adjacent to the surface of the SiOC insulating layer migrate into the barrier layer, and then form the barrier layer containing carbon atoms and hydrogen atoms. The chemical bonding status, concentration, and its concentration distribution of the hydrocarbon radicals in the SiOC insulating layer can be examined by using an analysis method such as an X-ray photoelectron spectroscopy (abbreviation: XPS), for example.

In case when such a SiOC insulating layer is used that in its original status, (in its as-grown state) the hydrocarbon radical concentration in its surface side for forming the coated layer is extremely decreased as compared with the concentration in its inside portion, it is difficult to fully and stably form the barrier layer according to the present invention. This is because the hydrocarbon radicals containing carbon and hydrogen atoms sufficient for forming the barrier layer cannot be transferred in the sufficient concentration into the barrier layer, which results in failing to form the barrier layer containing carbon atoms and hydrogen atoms.

On the other hand, in case when such a SiOC insulating layer is used that the hydrocarbon radical concentration in the region adjacent to the surface of the SiOC insulating layer is higher than the hydrocarbon radical concentration in its inside portion, the amount of the hydrocarbon radicals, which diffuse into the barrier layer, can increase, and which is not necessarily be a disadvantage in terms of forming the barrier layer containing carbon and hydrocarbon atoms. However, in a number of cases, the hydrocarbon radicals diffuse into the barrier layer in the way that the concentration of the hydrocarbon radicals is greater than that of the additional elements of the copper in the barrier layer. Therefore, there is a case that the electrical insulating characteristics of the barrier layer are aggravated. In addition, there is a case in which when a number of the carbon atoms exist, the interconnection body composed of copper, which has an excellent adhesiveness with the barrier layer, cannot be formed, which is disadvantageous.

It is thought that most of the hydrocarbon radicals diffuse towards the coated layer are decomposed into carbon atoms and hydrogen atoms by this heat treatment. Therefore, the carbon and hydrogen in the form in atoms, rather than the carbon or hydrogen existing in the form of the hydrocarbon radical, are thought to mainly exist in the barrier layer formed after the heat treatment to diffuse the hydrocarbon radicals is conducted. That is, rather than the carbon and hydrogen maintaining the form of the hydrocarbon radical, more carbon and hydrogen in the form of atoms are thought to exist in a position in the barrier layer's thickness direction where the atomic concentration of the additional elements such as manganese of the copper alloy is maximized.

Here, comparing atomic radii, the atomic radius of carbon is 0.91 Å, whereas the atomic radius of manganese is 1.35 Å. The covalent radius of hydrogen is a small radius of 0.32 Å. In case when carbon atoms and hydrogen atoms, which have size smaller than that of manganese, exist at their maximum concentrations in the position where the atomic concentration of the additional elements such as manganese of the copper alloy is maximized, the diffusion passages for copper or silicon inside the barrier layer can be effectively blocked as compared with the conventional barrier layer on which only additional elements of copper are simply deposited. (Refer to WO2007/100125A1). Accordingly, the barrier layer which is effective to suppress the diffusion of the copper and silicon can be provided.

In addition, the diffusion time, which is necessary to diffuse the sufficient hydrocarbon radicals, for constituting the barrier layer from the region adjacent to the surface of the SiOC insulating layer, is equal to or greater than 10 minutes to equal to or less than 80 minutes after the diffusion temperature described above is reached. The lower the diffusion temperature is set, the longer the diffusion time is needed. When the barrier layer is formed at the diffusion temperature described above using the Cu—Mn coated layer on the SiOC insulating layer which contains the methyl radical as the hydrocarbon radical, the layer thickness of the barrier layer which includes the manganese, carbon and hydrogen atoms, and is formed inside the coated layer increases substantially in proportion to the one-half power of the diffusion time during the passage of 10 minutes after the diffusion temperature is reached. The thickness of the barrier layer increases as if based on the general principle of diffusion where the diffusion length increases in proportion to the one-half power of the diffusion time.

Then, in case when the diffusion time is extended longer, the thickness of the barrier layer, which is formed at from the connected interface with the SiOC insulating layer toward the inner portion of the Cu—Mn coated layer, shows a saturated tendency and becomes substantially constant against the diffusion time. For example, without regard to the diffusion temperature (equal to or greater than 350° C., equal to or less than 450° C.), the thickness of the barrier layer, which is formed at the inside the Cu—Mn coated layer composed of the Cu—Mn alloy (the manganese content is equal to or greater than 1.0% to equal to and less than 25.0% in the atomic concentration) formed on the SiOC insulating layer containing the methyl radical as the hydrocarbon radical becomes substantially constant, such as about 2.5 nm, even if the diffusion time is 40 minutes or 80 minutes. In addition, there is an advantage in the present invention that the barrier layer having a substantially constant thickness can be formed even if the diffusion time difference occurs in the range of the diffusion time band where the thickness of the barrier layer is saturated.

The result of these operations shows that the barrier layer is formed at the inside of the Cu—Mn coated layer since the hydrocarbon radicals diffuse from the SiOC insulating layer containing the hydrocarbon radicals and reach the coated layer. That is, it is shown that the barrier layer containing carbon and hydrogen atoms according to the present invention can easily be formed without taking the time to use the source material including carbon and hydrogen atoms during the step of forming the barrier layer. Further, the reason why the barrier thickness does not increase so much when the diffusion time is extended, is considered as that the number of the hydrocarbon radicals, which can reach and diffuse into the coated layer, decreases. The hydrocarbon radicals which remain at the inside of the SiOC insulating layer without diffusing results in contributing to the maintenance of the electrical insulating properties of the SiOC insulating layer.

In the present invention, the barrier layer is composed of the oxide containing the additional elements of the copper alloy, carbon and hydrogen in the way that the maximal concentration of the carbon atoms is equal to or less than the maximal atomic concentration of the additional element of the copper alloy at a position in the barrier layer's thickness direction where the atomic concentration of the additional element of the copper alloy is maximized. In order to obtain the copper interconnection provided with the barrier layer which has an excellent adhesiveness with the copper interconnection body, and has an excellent electrical insulating properties, it is avoided to configure the barrier layer composed mainly of, not the oxides, but the carbides of the additional element of the copper alloy.

The oxide of the additional element of the copper alloy configuring the barrier layer is, for example, a manganese series oxide when the additional element of the copper alloy is manganese. The manganese series oxide means the oxide which is composed mainly of manganese and oxygen, and which includes copper being the main element of the coated layer. For example, the oxide is represented by the composition formula $Mn_XCu_YO$ ($0<X\leq1$, $0\leq Y<1$, $X+Y=1$, generally $X>Y$). In addition, the oxide is represented by the composition formula $Mn_XCu_YSi_ZO$ ($0<X\leq1$, $0\leq Y$, $Z<1$, $X+Y+Z=1$, generally $X>Y, Z$).

The carbon atoms cannot easily be removed by controlling the diffusion temperature and the diffusion time as compared with the hydrogen atoms which can be removed as the hydrogen gas from the barrier layer. One means for easily obtaining the barrier layer in which the maximal concentration of the carbon atoms is equal to or less than the maximal atomic concentration of the additional element of the copper alloy is to preliminarily adjust the concentration of the hydrocarbon radicals in the region adjacent to the surface of the SiOC insulating layer in the way that the hydrocarbon radicals can be supplied sufficiently during the formation of the barrier layer, and the concentration of the carbon atoms in the barrier layer is not over the atomic concentration of the additional element of the copper alloy. In order to adjust the concentration of the hydrocarbon radicals on the surface of the SiOC insulating layer, during the method for forming the SiOC insulating layer described above, increase or decrease of the supply of the source material of the hydrocarbon radicals can be controlled over time from the point when the coating of the insulating layer proceeds to the step of forming the layer in the region adjacent to the surface. As the region where the concentration of the hydrocarbon radicals are regulated, the region from the central portion of the thickness of the SiOC insulating layer to the surface side in which the barrier layer is formed is enough.

In addition, in the barrier layer of the present invention, it is preferable that the maximal concentration of hydrogen atoms at a position in the barrier layer's thickness direction where the atomic concentration of the additional element of the copper alloy is maximized, is equal or less than the maximal atomic concentration of the additional element of the copper alloy. In order to obtain the barrier layer which has an excellent adhesiveness with the copper interconnection body, and has an excellent electrical insulating properties, it is avoided to configure the barrier layer composed mainly of, not the oxides, but the hydrides of the additional element of the copper alloy.

The hydrogen atoms in the barrier layer can be effectively removed as hydrogen gases when the heat treatment for diffusing the hydrocarbon radicals described above is conducted. The amount of the hydrogen gases to be removed from the barrier layer can be adjusted by changing the diffusion temperature and the diffusion time. For example, there is a means for adjusting the maximal concentration of the hydrogen atoms in the barrier layer to be equal to or less than the maximal concentrations of the additional element of the copper alloy and the carbon atom by extending the diffusion time, at the diffusion temperature within the range described above, in order to make a lot of chances for the hydrogen atoms so as to be removed from the barrier layer as hydrogen gases. As described above, because there is a band of the diffusion time which does not affect the thickness of the barrier layer to be formed, in such a band of time, the hydrogen concentration inside the barrier layer can be freely decreased by adjusting the diffusion time.

In order to remove all of the hydrogen atoms, severe conditions of the heat treatment are sometime required. The severe conditions often make the barrier layer lose its surface flatness. The maximal concentration of the hydrogen atoms is enough as long as it is equal to or less than the maximal atomic concentration of the additional elements of the copper alloy. In addition, when the maximal concentration of the hydrogen atoms is equal to or less than the maximal concentration of the carbon atoms, significant troubles do not occur. Therefore, there is no need to dare to conduct the severe heat treatment in order to remove almost all the hydrogen atoms.

Regarding a concentration distribution of the carbon atoms and the hydrogen atoms inside the barrier layer, there is a preferable profile. That is, it is not preferable to have a uniform distribution, but it is preferable to show a concentration distribution in the form of a normal distribution curve. In particular, it is preferable to have a distribution in the form of the normal distribution curve in the way that the concentrations is maximized at the substantially central portion in the barrier layer's thickness direction. It is the most preferable to have a distribution in the form of the normal distribution curve in the way that the concentrations of the additional element of the copper, the carbon atoms, and the hydrogen atoms are maximized at the substantially central position in the barrier layer's thickness direction.

In addition to the conditions of the diffusion temperature and diffusion time described above, which are decided by considering the type of a hydrocarbon radical, especially by the size of the hydrocarbon radical, which determines the difficulty level of diffusion, it is required to conduct the heat treatment for diffusing the hydrocarbon radicals under an inert gas atmosphere including oxygen in the range of equal to or greater than 0.5 vol.ppm to equal to or less than 1.5 vol.ppm in the volume concentration so that the additional elements of the copper alloy, the carbon atoms, and the hydrogen atoms inside the barrier layer can be distributed in the form of the normal distribution curve. As the inert gas constituting the inert gas atmosphere, helium (element symbol: He), neon (element symbol: Ne), argon (element symbol: Ar), krypton (element symbol: Kr), xenon (element symbol: Xe) and the like can be listed. Out of them, the use of He, Ne or Ar as the inert gas is desirable.

The segregation of the carbon atoms, the hydrogen atoms and the additional elements of the copper alloy at the region adjacent to the connected interface with the SiOC insulating layer, which often occurs under an atmosphere including too little oxygen volume concentration b (b<0.5 vol.ppm), can be suppressed. This is because the heat treatment is conducted under such a limited atmosphere in which the oxygen volume concentration b is over the oxygen volume concentration a (a; <0.5 vol.ppm) which is the atmosphere during the deposition of the coated layer to be barrier layer, at the same time, the oxygen volume concentration b is equal to or greater than 0.5 vol. ppm to equal to or less than 1.5 vol.ppm. In addition, the segregation of the carbon atoms, the hydrogen atoms, and the additional atoms of the copper alloy at the region adjacent to the connected interface with the copper interconnection body, which occurs under an atmosphere including excessive oxygen volume concentration b (b>1.5 vol.ppm), can also be suppressed.

Therefore, the barrier layer in which the carbon atoms and the hydrogen atoms inside the barrier layer are distributed in the form of the normal distribution curve, can be formed by heat-treating the coated layer composed of the Cu—Mn alloy for forming the barrier layer under the inert gas atmosphere including oxygen in the range of the volume concentration described above. Further, the barrier layer in which the atomic concentrations of the carbon atoms and the hydrogen atoms are maximized at a position in the barrier layer's thickness direction where the atomic concentration of the additional elements of the copper alloy such as manganese is maximized, can be formed. Furthermore, by adjusting the diffusion time, the additional element of the copper alloy such as manganese, the carbon atoms and the hydrogen atoms can be distributed in the form of the normal distribution curve so that each atomic concentration is maximized at a substantially central position in the barrier layer's thickness direction.

In order to distribute the additional element of the copper alloy such as manganese, the carbon atoms and the hydrogen atoms in the form of the normal distribution curve in which the atomic concentration is maximized at the substantially central position in the barrier layer's thickness direction, it is required to conduct the heat treatment for longer period beyond the time of band in which the thickness of the barrier layer to be formed increases in proportion to the diffusion time described above. For example, it is desirable to heat the coated layer composed of the Cu—Mn alloy, which is formed on the SiOC insulating layer including the methyl radicals as the hydrocarbon radicals under the argon atmosphere including oxygen of 1.0 vol. ppm in the volume concentration for 20 minutes to 80 minutes. Further, it is more preferable to heat for 30 minutes to 40 minutes.

When the carbon atoms are distributed in the form of the normal distribution curve where the carbon atomic concentration is maximized at a central position in the barrier layer's thickness direction, the carbon atomic concentration at a surface region, which is near the jointing side with the copper interconnection body, can be decreased. Therefore, the copper interconnection having the barrier layer which is excellent in the adhesiveness with the copper interconnection body can be obtained. In addition, when the hydrogen atoms are distributed in the form of the normal distribution curve where the hydrogen atomic concentration is maximized at the central position in the barrier layer's thickness direction, that is, the situation means that the hydrogen atoms at its maximal concentration exist in the center of the barrier layer, wherein a distance from the joint interface with the SiOC insulating layer to the center and a distance from the joint interface with the copper interconnection body to the center is substantially the same. Therefore, the diffusion of silicon and the diffusion of the copper can be effectively suppressed in the substantially same level.

Each concentration of the additional element of the copper alloy, the carbon atoms, and the hydrogen atoms in the barrier layer, and the distribution status of each concentration in the thickness direction can be examined by using physical elemental analysis methods such as a secondary ion mass spectroscopy (abbreviation: SIMS) and an electron energy-loss spectroscopy (abbreviation: EELS). Incidentally, the concentration distribution in the form of the normal distribution curve where the atomic concentration is maximized at the central position in the barrier layer's thickness direction (that is, the position which is corresponding to a half thickness of the all thickness of the barrier layer) means a Gaussian distribution in which, for example, the carbon atomic concentration $N(x)$ at the position (x) in the barrier layer's thickness direction is represented by a relational expression $N(x)=\{Q/(\sigma \cdot (2\pi)^{1/2})\} \exp\{-(x-t)^2/(2 \cdot \sigma^2)\}$ with using a half thickness (t) of the entire thickness of the barrier layer. Incidentally, in the relational expression described above, the symbol Q is an independent constant about atomic concentrations, and the symbol σ represents the deviation about concentrations.

If the heat treatment is conducted to the coated layer, which is previously formed to be embedded at the inside of interconnection grooves such as the trench grooves formed on the SiOC insulating layer, the barrier layer is formed at the surface region of the coated layer which is connected to the SiOC insulating layer, and further, the inside of the coated layer becomes a conducting portion which mainly includes copper which still remains even after the additional elements of the copper alloy has been migrated. The conducting portion is protected from contaminations of elements configuring the SiOC insulating layer by the functions of the barrier layer formed around the conducting portion, the conducting portion can show a low-value electrical resistivity which is the same as the resistivity of pure copper (1.7 μΩ·cm (Japanese Unexamined Patent Application Publication No. 2-50432)). Therefore, a semiconductor device having a low interconnection electrical resistance can be configured by using such a conducting portion as the interconnection body.

In a case that the coated layer formed in the grooves for interconnections of the SiOC insulating layer is too thin to fill all the interconnection grooves enough, the copper interconnection body can be formed from copper which is filled in the interconnection grooves so as to cover the interconnection grooves by using the thin coated layer as a seed. The copper which is filled in the interconnection grooves is formed by an electroplating method, an ion plating method, and a sputtering method. In a case that copper is placed on the coated layer in such a way that the copper fills all of the interconnection grooves, the diffusion treatment described above can be conducted at either timing of after the coated layer of the copper alloy is formed or after the copper to be the interconnection body is filled on the coated layer.

The content of the present invention will be explained by an example in which a barrier layer formed by a Cu—Mn coated layer as its material is used for a copper interconnection.

First Embodiment

Figure 1:
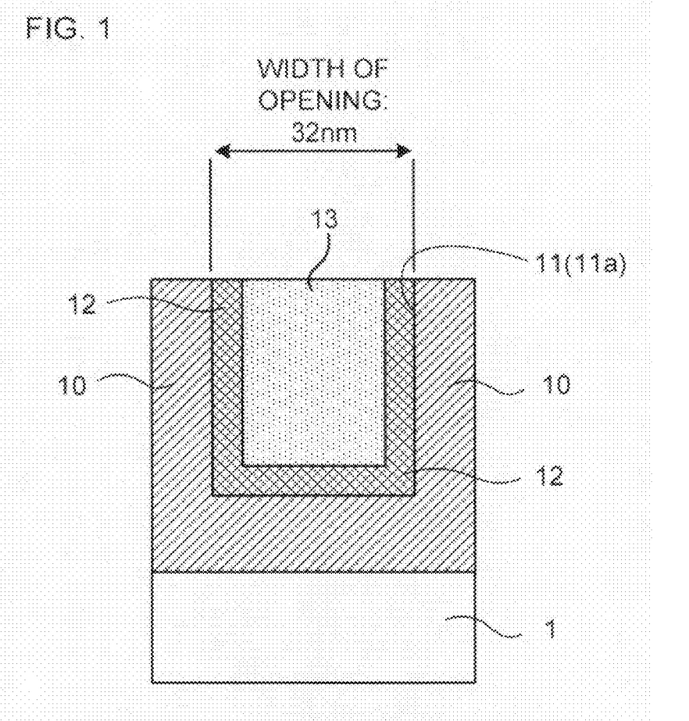
FIG. 1 is a cross-sectional view schematically illustrating a copper interconnection structure according to a first embodiment.

FIG. 1 schematically illustrates a cross section structure of a damascene type copper interconnection structure according to the present first embodiment. On a silicon substrate 1, an interlayer insulating film 10 is formed. The interlayer insulating film 10 is structured by methyl silsesquioxane (abbreviation: MSQ) including a methyl radical ($CH_3$—) as a hydrocarbon radical having one carbon atom. In the interlayer insulating film 10, an interconnection trench groove 11 having an opening width of about 32 nanometers (unit: nm) is formed. The thickness of the interlayer insulating film 10 is about 150 nm. A sidewall 11a of the trench groove 11 on the interlayer insulating film 10 is covered with a copper-manganese (Cu—Mn) alloy film 12 including manganese (Mn) at the ratio of about 7 atom % (at. %) in the atomic concentration. On the Cu—Mn alloy film 12, a copper (Cu) filling layer 13 is formed to fill the inside of the trench groove 11.

The Cu—Mn alloy film 12 is formed by a sputtering method by using a Cu—Mn alloy material containing Mn in the ratio of about 7 atom % (at. %) in the atomic concentration as a sputtering target. The Cu—Mn alloy film 12 to form a barrier layer is formed under a highly-pure argon (Ar) atmosphere containing little oxygen where the oxygen concentration is under 0.1 ppm in the volume parts per million (vol.ppm). The Cu—Mn alloy film 12 has a thickness of 30 nm.

The material for a MSQ film constituting the interlayer insulating film 10 is trimethylsilane (molecular formula: $(CH_3)_3SiH$) including a Si atom and a hydrocarbon radical. In addition, oxygen gas is used as a material including oxygen to form the MSQ film with a conventional plasma CVD method. The MSQ film is formed at 280° C., which is lower than a temperature (which is the diffusion temperature described herein) used when the Cu—Mn alloy film 12 is heated to form a barrier layer, which is described below.

In the MSQ film constituting the interlayer insulating film 10, there are small pores almost uniformly, the size of the pores is under 1 nm in diameter. Most of the small pores have a diameter of 0.7 nm to 0.8 nm. The porosity (refer to [BUTSURIGAKUJITEN (Physics dictionary)], first edition, p, 518, issued on 30 Sep. 1984, by BAIHUKAN, under the editorship of editorial committee for the physics dictionary) is 30%. In addition, the electric permittivity of the MSQ film is 2.3 at room temperature.

Figure 2:
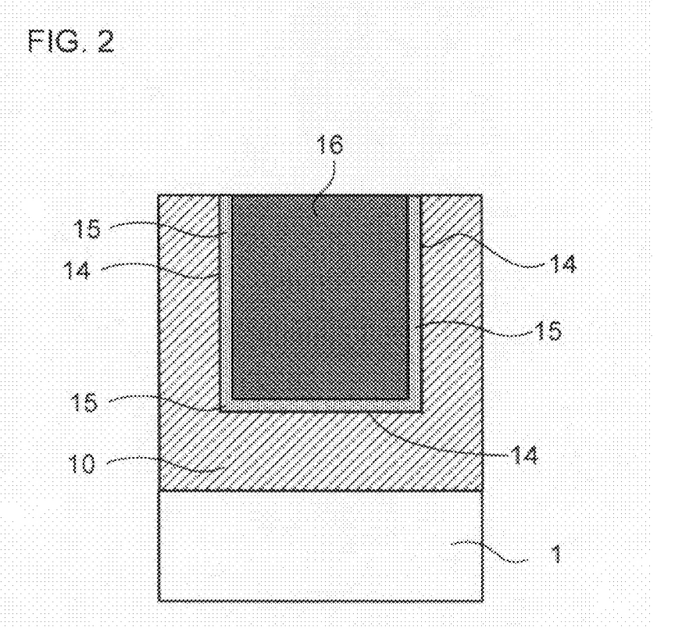
FIG. 2 is a cross-sectional view schematically illustrating a copper interconnection after a heat treatment according to the first embodiment.

Next, the interconnection of the cross section structure illustrated in FIG. 1 is heated at 300° C. of heat treatment temperature (diffusion temperature). This heat treatment is conducted for 30 minutes under an Ar atmosphere including 1.0 vol. ppm of oxygen gas in the volume concentration. As a result, Mn in the Cu—Mn alloy film 12 diffuses by the heat, and a barrier layer 15 is formed in between the interlayer insulating film 10 and the copper filling layer 13 (FIG. 2). The barrier layer 15 has the thickness of 2.5 nm. In addition, by diffusing Mn toward an interfacial surface 14 between the interlayer insulating film 10 and the Cu—Mn alloy film 12, a portion of the Cu—Mn alloy film 12 in a region near the copper filling layer 13, which is mainly structured by Cu now, and the copper filling layer 13 is integrated to form a Cu interconnection body 16. FIG. 2 schematically shows the cross section structure of the Cu interconnection which is inside the trench groove 11 after the heat treatment at the diffusion temperature described above is conducted.

The elements included in the barrier layer 15 formed by the heat treatment described above are qualitatively analyzed with a conventional electron energy-loss spectroscopy (abbreviation: EELS) method. As main elements constituting the barrier layer 15, oxygen (O), Mn, carbon (C), hydrogen (H), Cu, and Si are detected. Accordingly, it turns out that the barrier layer 15 is an oxide layer which includes Mn as an additional element of the Cu alloy film, as well as carbon (C) and hydrogen (H).

Figure 3:
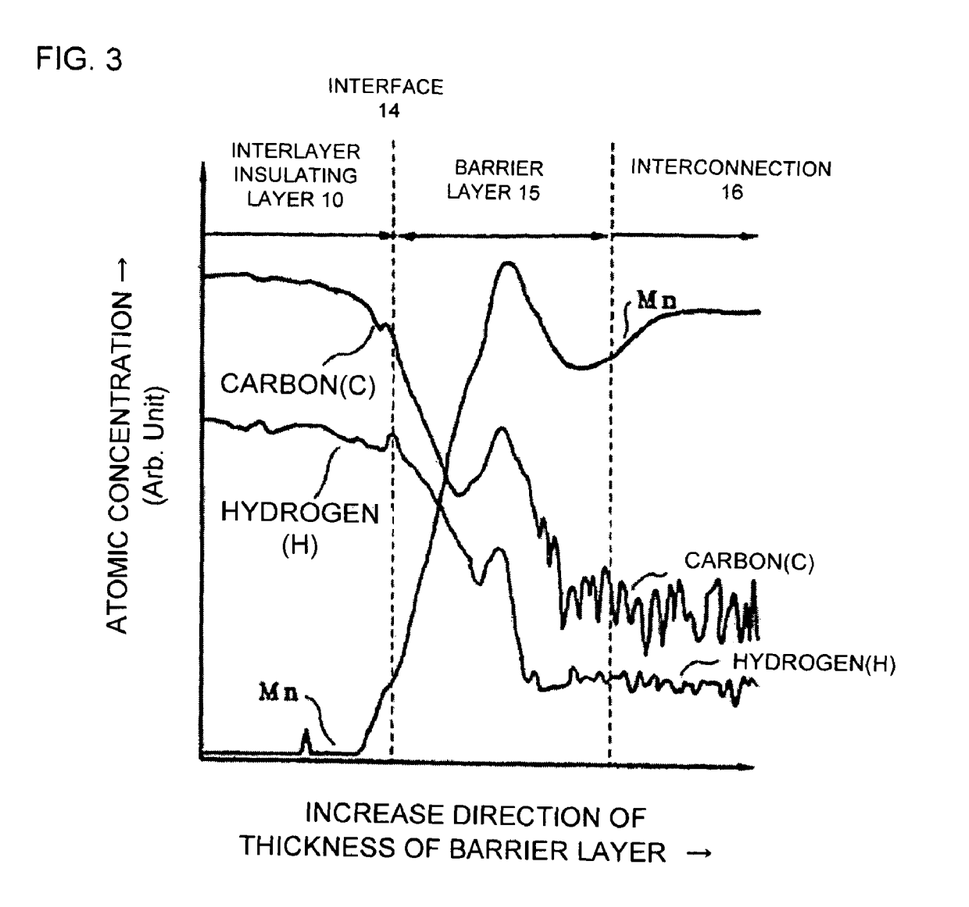
FIG. 3 is a view illustrating an atomic concentration distribution in a barrier layer after a heat treatment.

FIG. 3 illustrates a concentration distribution of the elements included inside the barrier layer 15. This concentration distribution of the elements is measured by an EELS method. Mn is distributed in the form of the normal distribution curve in which Mn atomic concentration is maximized at a central portion in the barrier layer 15's thickness direction. Both of carbon (C) and hydrogen (H) are distributed in the form of the normal distribution curve in which the atomic concentrations in the layer 15 are maximized at a central portion in the barrier layer 15's thickness direction.

Even though, Mn, carbon (C), and hydrogen (H) distribute in the way that each atomic concentration is maximized at the central portion in the barrier layer 15, each maximum concentration of these atomic concentrations is different from each other. In the view of the thickness of the atomic concentration, Mn atomic concentration included in the Cu alloy film as the additional element is the highest, and the carbon (C) atomic concentration is equal to or less than that of Mn atomic concentration, and the hydrogen (H) atomic concentration is equal to or less than the carbon atomic concentration (refer to FIG. 3).

The electrical resistivity of the Cu interconnection body 16 formed by the heat treatment described above is measured. The electrical resistivity of the Cu interconnection body 16 is 1.9 microhm·centimeter ($\mu\Omega\cdot cm$), which is substantially the same as pure Cu. (The electrical resistivity of pure Cu is 1.7 $\mu\Omega\cdot cm$). That is, it turns out that according to the present invention, the Cu interconnection which has almost the same low-value of electrical resistance as a pure Cu bulk material, and is advantageous to compose variety of electronic apparatus can be achieved.

Second Embodiment

As described in the first embodiment described above, an interconnection trench groove having an opening width of about 32 nm is formed at the interlayer insulating film composed of MSQ including a methyl radical ($CH^3$—) as a hydrocarbon radical having one carbon atom. At the sidewall of the trench groove in the interlayer insulating film, a Cu—Mn alloy film containing Mn in the rate of 7 atom % in the atomic concentration is coated. On the Cu—Mn alloy film, a Cu filling layer is formed so as to fill inside the trench groove. As a result, a cross section structure having a damascene type copper interconnection structure illustrated schematically in the FIG. 1 is formed.

The Cu—Mn alloy film is formed by a sputtering method by using a Cu—Mn alloy material containing Mn in the ratio of about 7 atom % (at. %) in the atomic concentration as a sputter target. The Cu—Mn alloy film to form a barrier layer is formed under a highly-pure argon (Ar) atmosphere containing the oxygen concentration of 0.5 vol.ppm. The Cu—Mn alloy film has a thickness of 30 nm.

The material for the MSQ film constituting the interlayer insulating film is trimethylsilane (molecular formula: $(CH_3)_3SiH$) including a Si atom and a hydrocarbon radical. In addition, oxygen gas is used as a material including oxygen to form the MSQ film with a general plasma CVD method. The MSQ film is formed at 300° C., which is lower than a temperature (which is the diffusion temperature described herein) used when the Cu—Mn alloy film is heated to form a barrier layer, which is described below.

In the MSQ film constituting the interlayer insulating film, there are small pores almost uniformly, the size of the pores is under 1 micrometer ($\mu m$) in diameter. Most of the small pores have a diameter of 1.2 nm to 1.5 nm. The porosity is 30%. In addition, the electric permittivity of the MSQ film is 2.3 at room temperature, like the first embodiment described above.

Next, the interconnection having this structure is heated at 350° C. of heat treatment temperature (diffusion temperature). This heat treatment is conducted for 30 minutes under an Ar atmosphere including 1.0 vol. ppm of oxygen gas in the volume concentration. As a result, Mn in the Cu—Mn alloy film diffuses by the heat, and a barrier layer is formed in between the interlayer insulating film and the copper filling layer. By diffusing Mn toward an interfacial surface between the interlayer insulating film and the Cu—Mn alloy film, a portion of the Cu—Mn alloy film, which is in a region near the copper filling layer and results in being mainly structured by Cu now, is integrated with the copper filling layer to form a Cu interconnection body. Refer to FIG. 2.

Even though the heat treatment of the second embodiment is conducted at the diffusion temperature, which is different from the first embodiment, under the atmosphere containing the oxygen gas concentration, which is different from the first embodiment, the thickness of the resulting barrier layer has 2.5 nm, which is the same as the first embodiment.

According to the result of the qualitative analysis by a conventional EELS method, it turns out that main elements constituting the barrier layer are oxygen (O), Mn, carbon (C), hydrogen (H), Cu and Si. Accordingly, it is shown that the barrier layer is an oxide layer, which includes Mn as an additional element of the Cu alloy film as well as carbon (C) and hydrogen (H).

The concentration distribution of these elements inside the barrier layer is measured by a conventional EELS method. Mn is distributed in the form of the normal distribution curve in which Mn atomic concentration is maximized at a central portion in the barrier layer's thickness direction. Both of carbon (C) and hydrogen (H) are, like the case of Mn, distributed in the form of the normal distribution curve in which the atomic concentrations in the barrier layer are maximized at the central portion in the barrier layer's thickness direction. In addition, the concentrations of the carbon and hydrogen in the region adjacent to the surface side of the MSQ interlayer insulating film which contacts with the Cu—Mn alloy film are significantly decreased after the barrier layer is formed by the heat treatment. Therefore, the carbon and hydrogen contained inside the barrier layer is thought to be derived from the methyl radicals which are diffused from the inside of the interlayer insulating film into inside of the barrier layer.

Even though, Mn, carbon (C) and hydrogen (H) distribute in the way that each atomic concentration is maximized at the central portion in the barrier layer, each maximum concentration of these atomic concentrations is different from each other. In the viewpoint of the thickness of the atomic concentration, Mn atomic concentration included in the Cu alloy film as the additional element is the highest, and the carbon (C) atomic concentration is equal to or less than that of Mn atomic concentration, and the hydrogen (H) atomic concentration is equal to or less than the carbon atomic concentration. According to the quantitative result of the time of flight (TOF) type SIMS, the maximal atomic concentrations of carbon (C) and hydrogen (H) in the barrier layer are $3 \times 10^{21}$ atom/cm$^3$, and $5 \times 10^{20}$ atom/cm$^3$, respectively, whereas the maximal atomic concentrations of Mn in the barrier layer is $2 \times 10^{22}$ atom/cm$^3$.

The electrical resistivity of the Cu interconnection body formed by the heat treatment described above is measured. The electrical resistivity of the Cu interconnection body is 1.9 ($\mu\Omega \cdot$cm), which is substantially the same as pure Cu. (The electrical resistivity of pure Cu is 1.7 $\mu\Omega \cdot$cm) That is, it turns out that according to the present invention, the Cu interconnection which has almost the same low resistance-value as a pure Cu bulk material, and is advantageous to form variety of electronic apparatuses can be achieved.

The copper interconnection having the structure of the present invention has a low electrical resistance-value which is advantageous to effectively pass a device operation current. In addition, because the copper interconnection having the structure of the present invention includes the barrier layer containing carbon and hydrogen, which have effects to block diffusion passages due to their small atom size, the leakage of the device operation current can be kept at a negligibly low value of less than nano ampere (nA). Therefore, the copper interconnection having the structure of the present invention can be advantageously used to form low power consumption type semiconductor devices. For example, the copper interconnection having the structure of the present invention can be used to form a large-size liquid crystal display (LCD) having a small RC delay, a flat display device (abbreviation: FDP), an organic electroluminescence (abbreviation: EL) device, an electronic display device such as an inorganic EL device and a memory device such as NAND type flash memory, and the like.

In addition, since the barrier layer structured in the copper interconnection of the present invention, the barrier layer including the additional element of the copper alloy, the carbon atom and the hydrogen atom, is formed by using the diffusion of the hydrocarbon radicals contained in the SiOC insulating layer, the barrier layer can be easily formed. Further, the oxide film in which the concentrations of the carbon atoms and hydrogen atoms are distributed in the form of the normal distribution curve can be formed as the barrier layer. Therefore, the film, which is thin, can work as a barrier layer, and there is no need to form a conventional thick barrier layer made from such as tantalum. Accordingly, the copper interconnection of the present invention can be used to configure a microscopic circuit interconnection for a silicon LSI having a small interconnection width such as equal to or less than 32 nm because the copper interconnection of the present invention can be highly integrated.

In addition, since the copper interconnection according to the present invention is structured by the low-resistance interconnection body and the barrier layer which can advantageously prevent the leakage of the device operation current, the copper interconnection according to the present invention can be used to configure circuit interconnections and electrodes for power devices formed by silicon or silicon-germanium (SiGe) which need to pass a large device operation current. In addition, the copper interconnection according to the present invention can be used to configure each electrode of a gate, a source and a drain of a thin-film transistor (abbreviation: TFT) used for LCD.

As described above, embodiments of this present invention are explained with reference to drawings. However, this invention is not limited to those illustrated embodiments. Various changes and modifications may be made to the illustrated embodiments without departing from the scope which is the same as or equivalent to this invention.

What is claimed is:

1. A copper interconnection structure, comprising:
   an insulating layer including silicon (element symbol: Si), carbon (element symbol: C), hydrogen (element symbol: H) and oxygen (element symbol: O);
   an interconnection located on the insulating layer, the interconnection including copper (element symbol: Cu); and
   a barrier layer located between the insulating layer and the interconnection, the barrier layer including an additional element, carbon (element symbol: C) and hydrogen (element symbol: H);
   wherein the barrier layer has atomic concentrations of carbon (element symbol: C) and hydrogen (element symbol: H) maximized in a region of a thickness of the barrier layer where the atomic concentration of the additional element is maximized.

2. The copper interconnection structure of claim 1, wherein the insulating layer includes carbon (element symbol: C) and hydrogen (H) as a hydrocarbon radical.

3. The copper interconnection structure of claim 2, wherein the number of the carbon (element symbol: C) atom of hydrocarbon radical is one or two.

4. The copper interconnection structure of claim 2, wherein the hydrocarbon radical includes a methyl radical (—CH$_3$).

5. The copper interconnection structure of claim 1, wherein the additional element is manganese (element symbol: Mn).

6. The copper interconnection structure of claim 1, wherein the barrier layer has the atomic concentration of carbon (element symbol: C) or hydrogen (element symbol: H) maximized in a central region of a thickness of the barrier layer.

7. The copper interconnection structure of claim 1, wherein the maximum atomic concentration of the carbon (element symbol: C) in the barrier layer is not more than the maximum atomic concentration of the additional element in the barrier layer.

8. The copper interconnection structure of claim 1, wherein the maximum atomic concentration of the hydrogen (element symbol: H) in the barrier layer is not more than the maximum atomic concentration of the additional element in the barrier layer.

9. The copper interconnection structure of claim 8, wherein the maximum atomic concentration of the hydrogen (element symbol: H) in the barrier layer is not more than the maximum atomic concentration of the carbon (element symbol: C) in the barrier layer.

10. A semiconductor device having a copper interconnection, comprising:
- a silicon oxide carbide (SiOC) insulating film formed over a semiconductor substrate, the SiOC insulating film including silicon (element symbol: Si), oxygen (element symbol: O) and carbon (element symbol: C) in a form of a hydrocarbon radical;
- a barrier layer formed on an inner surface of a groove disposed on the SiOC insulating film, the barrier layer including manganese (element symbol: Mn), carbon (element symbol: C) and hydrogen (element symbol: H); and
- an interconnection formed on the barrier layer and buried in the groove, the interconnection including copper (element symbol: Cu);
- wherein the barrier layer has atomic concentrations of carbon (element symbol: C) and hydrogen (element symbol: H) maximized in a part of a thickness of the barrier layer in which the atomic concentration of the manganese (element symbol: Mn) is maximized.

11. The semiconductor device of claim 10, wherein the barrier layer has the atomic concentration of carbon (element symbol: C) or hydrogen (element symbol: H) maximized in a central part of a thickness of the barrier layer.

12. The semiconductor device of claim 10, wherein the maximum atomic concentration of the carbon (element symbol: C) in the barrier layer is not more than the maximum atomic concentration of the manganese (element symbol: Mn) in the barrier layer, and the maximum atomic concentration of the hydrogen (element symbol: H) in the barrier layer is not more than the maximum atomic concentration of the carbon (element symbol: C) in the barrier layer.

* * * * *